United States Patent [19]
Gigantino et al.

[11] Patent Number: 5,840,464
[45] Date of Patent: Nov. 24, 1998

[54] SINGLE COATING TRANSFER COLOR PROOFING SYSTEM

[76] Inventors: John J. Gigantino, 124 W. Sixth Ave., Roselle, N.J. 07203; David L. Siegfried, 139 Mill Pond Pl., Langhorne, Pa. 19047; Rhonda L. Stark, P.O. Box 103, Oxford, N.J. 07863

[21] Appl. No.: 490,218

[22] Filed: Jun. 14, 1995

Related U.S. Application Data

[63] Continuation-in-part of Ser. No. 246,018, May 19, 1994, abandoned.

[51] Int. Cl.$^6$ .............................. G03C 11/12; C03F 7/30
[52] U.S. Cl. .......................... 430/257; 430/260; 430/262; 430/293
[58] Field of Search ..................... 430/257, 260, 430/262, 263, 293, 271.1, 143

[56] References Cited

U.S. PATENT DOCUMENTS

| | | | |
|---|---|---|---|
| 4,963,462 | 10/1990 | Wilczak | 430/257 |
| 5,094,931 | 3/1992 | Platzer | 430/257 |
| 5,100,757 | 3/1992 | Platzer et al. | 430/257 |

*Primary Examiner*—John S. Chu
*Attorney, Agent, or Firm*—Roberts & Mercanti, L.L.P.

[57] ABSTRACT

This invention relates to a single negative working photosensitive, photopolymerizable layer on a substrate which, upon exposure to an actinic radiation source through a screened image, can accurately reproduce said image after lamination and processing. The construction is useful as a color proofing film which provides low dot gain and can be employed to predict the image quality from a lithographic printing process.

12 Claims, No Drawings

SINGLE COATING TRANSFER COLOR PROOFING SYSTEM

This is a continuation-in-part of application Ser. No. 08/246,018 filed on May 19, 1994, now abandoned.

BACKGROUND OF THE INVENTION

In the graphic arts, it is desirable to produce a color proof to assist a printer in correcting a set of photomasks which will be used in exposing printing plates. The proof should reproduce the color quality that will be obtained during the printing process. The proof must be a consistent duplicate of the desired half tone or line image, and should neither gain nor lose color. Visual examination of a color proof should reveal any defects on the photomask; the best color rendition to be expected from press printing of the material; the correct gradation of all colors and whether grays are neutral; and the need, if any, for subduing any of the colors and/or giving directions for alternating the film photomask before making the printing plates.

Color proofing sheets for multi-colored printing have heretofore been made by using a printing press proof which requires taking all the steps necessary for actual multicolor printing. Such a conventional method of color proofing has been costly and time consuming. Alternate color proofing methods have therefore been developed to simulate the quality of press proofs. There are two known types of photographic color proofing methods, namely the surprint type and the overlay type.

In the overlay type of color proofing, an independent transparent plastic support is used for producing an image of each color separation film. A number of such supports carrying colored images are then superimposed upon each other and placed on a white sheet to produce a color proof. The overlay type of color proofing method has the disadvantage that the superimposed plastic supports tend to darken the color proofing sheet, and, as a result, the impression of the color proofing sheet thus prepared becomes vastly different from copies actually obtained by a conventional printing press proof. Its primary advantage is that it is quick and can serve as a progressive proof by combining any two or more colors in register.

In the surprint type of color proofing method, a color proofing sheet is prepared by successively producing images of different colors from different color separation films into a single receptor sheet. This is done by utilizing a single opaque support and by applying toners, photosensitive solutions or coatings of photosensitive materials of corresponding colors on the opaque support in succession. An example of this approach is described in U.S. Pat. No. 3,671,236. An advantage of the surprint type of color proof is that the color saturation is not influenced by superimposed plastic supports. This method more closely resembles the actual printing and eliminates the color distortion inherent in the overlay system.

Various processes for producing copies of a image embodying photopolymerization and thermal transfer techniques are known as shown in U.S. Pat. Nos. 3,060,023; 3,060,024; 3,060,025; 3,481,736; and 3,607,264. In these processes, a photopolymerizable layer coated on a suitable support is imagewise exposed to a photographic transparency. The surface of the exposed layer is then pressed into contact with the image receptive surface of a separate element and at least one of the elements is heated to a temperature above the transfer temperature of the unexposed portions of the layer. The two elements are then separated, whereby the thermally transferable, unexposed, image areas of the composite transfer to the image receptive element. If the element is not precolored, the tacky unexposed image may now be selectively colored with a desired toner. The colored matter preferentially adheres to the clear unpolymerized material. U.S. Pat. No. 3,574,049 provides a transfer process for printing a design on a final support which comprises (a) printing a design onto a temporary support, (b) superimposing the temporary support and the final support, (c) applying heat and/or pressure to the superimposed structure formed in (b), and (d) separating the temporary support from the final support which retains the printed design. The affinity of the design for the temporary support is lower than its affinity for the final support.

In U.S. Pat. No. 3,721,557 a method of transferring colored images is claimed which provides a stripping layer coated between the photosensitive element and the support. When the photosensitive layer is exposed to actinic light and developed, the more soluble portions are selectively removed to produce a visible image. The image-carrying support is pressed against a suitable adhesive coated receptor member and, subsequently, the carrier support sheet is stripped to accomplish the transfer of the image. A fresh layer of adhesive is applied to the receptor of each subsequent transfer.

SUMMARY OF THE INVENTION

The present invention provides an improved method for forming a colored image which comprises:

A) providing a photosensitive element which comprises, in order:
  i) a substrate having a release surface; and
  ii) a photosensitive layer being coated, at a dry coating weight of from about 0.1 to 5.0 g/m$^2$, directly on said release surface, which photosensitive layer comprises: 1) a light sensitive, negative working, photopolymerizable composition, which composition contains a photoinitiator and a polymerizable monomer or monomer mixture; 2) a resinous film forming binder composition, which comprises a styrene maleic anhydride copolymer; 3) an adhesive resin; and 4) at least one colorant; and B) either
  i) laminating said element with heat and pressure with said photosensitive layer being laminated directly to a developed resistant receiver sheet; and removing said substrate by the application of peeling forces; and imagewise exposing said photosensitive layer to actinic radiation; and removing nonexposed areas of a negative working photosensitive layer; or
  ii) imagewise exposing said photosensitive layer to actinic radiation; and laminating said element with heat and pressure with said photosensitive layer to a developer resistant receiver sheet; and removing nonexposed areas of a negative working photosensitive layer or exposed areas of a positive working photosensitive layer with a liquid developer; or
  iii) laminating said element with heat and pressure with said photosensitive layer being laminated directly to a developer resistant receiver sheet; and imagewise exposing said photosensitive layer to actinic radiation; and removing said substrate by the application of peeling forces; and removing nonexposed areas of a negative working photosensitive layer or exposed areas of a positive working photosensitive layer with a liquid developer; or iv) imagewise exposing said photosensitive layer to actinic radiation; and removing nonexposed areas of a negative working photosensitive layer or exposed areas of a positive working photosensitive layer with a liquid developer; laminating said element with heat and pressure with said photosensitive layer being laminated directly to a developer resistant receiver sheet; and removing said substrate by the application of peel forces; and preferably C) repeating steps A and B at least once whereby another photosensitive element having at least one different colorant is laminated onto said receptor sheet over the non-removed portions of the previously laminated photosensitive layer or layers.

The invention further relates to a photosensitive element which comprises, in order:

i) a substrate having a release surface; and ii) a photosensitive layer coated, at a dry coating weight of from about 0.1 to 5.0 $g/m^2$, directly on said release surface, which photosensitive layer comprises: 1) a light sensitive, negative working, photopolymerizable composition, which composition contains a photoinitiator and a polymerizable monomer; and 2) a film forming resinous binder composition, which composition comprises a styrene maleic anhydride copolymer; 3) an adhesive resin; and 4) at least one colorant.

DETAILED DESCRIPTION OF THE PREFERRED EMBODIMENT

In carrying out the method of the invention, one employs a photographic element which broadly comprises a substrate having a release surface and a colored photosensitive layer on the release surface. Additional layers, such as adhesives and barrier layers, are not required.

In the preferred embodiment, the substrate is composed of a dimensionally and chemically stable base material which does not significantly change its size, shape or chemical properties as the result of the heating, coating, or other treatments which it must undergo. One preferred material is polyethylene terephthalate. In the usual case it has a thickness of from about $2.54 \times 10^{-5}$ to about $2.54 \times 10^{-4}$ meter (about 1 to about 10 mils), a more preferred thickness is from about $5.08 \times 10^{-5}$ to about $12.7 \times 10^{-5}$ meter (about 2 to about 5 mils) and most preferably from about $5.08 \times 10^{-5}$ to about $7.62 \times 10^{-5}$ meter (about 2 to about 3 mils). Suitable films include Hostaphan® 3000 film, available from American Hoechst Corporation; Mylar® D film, available from DuPont; and Melinex® film grades 0, 052, 442, 516 and S, available from ICI. The surface of the substrate may be smooth or may be provided with a matte texture by various methods known in the art.

Matte films include Melinex® films 377 and 470 from ICI. These materials have the unique property of giving the final image a desired matte finish without any extra steps. One can control the gloss of the final image by properly selecting the matte finish of the substrate. This effect works because the top layer of the final image is originally in contact with this matte surface. An additional advantage of coating on a matte surface is that subsequent transferred layers generally adhere better to a rough surface than to a smooth surface.

A similar matte finish of the final image can be obtained by embossing the shiny, top surface of the image with a matte material, such as described above. This is done by laminating together the final image and matte material under pressure and temperature. The matte material is then generally removed after lamination. The advantage of this method is that the finish of the final proof can be varied. Furthermore, the matting material can be used repeatedly.

A third method for producing a matte finish uses a heat transferable layer, such as Butvar® 90 resin, available from Monsanto, coated onto a film with a rough surface, such as Melinex® 329 film, available from ICI. The adhesive layer is laminated to the final image under pressure and temperature. Then the film with the rough surface is peeled off. The rough surface imparts a matte finish to the final image. The advantage is that all layers appear matte and that the extra adhesive layer protects the image. U.S. Pat. Nos. 4,294,090 and 4,376,159, also suggests various methods for making a matte surface.

In either case, the substrate must have a release surface, that is, it must be capable of releasably holding the photosensitive layer thereto. This may be accomplished either by the substrate surface being inherently releasable, being rendered releasable by a suitable treatment, or being provided with a release layer over the substrate surface. Such a release layer may comprise polyvinyl alcohol.

Releasably bonded to the release surface is the photosensitive layer. The photosensitive layer comprises a photoinitiator, a monomer or mixture of monomers capable of forming a crosslinked network, a colorant, a binding resin, an adhesive resin, and other optional ingredients such as plasticizers, acid stabilizers, surfactants, anti-static compositions, uv absorbers and residual coating solvents.

The photoinitiator is preferably highly capable of generating free-radicals suitable for initiating polymerization when exposed to ultraviolet light. The most preferred photoinitiators are 2-(4-phenyl)phenyl-4,6-bis-trichloromethyl-s-triazine, as taught in U.S. Pat. No. 4,696,888, and 2-(4-styrylphenyl)-4,6-bis-trichloromethyl-s-triazine, as taught in U.S. Pat. No. 4,619,998. Other suitable photoinitiators include 2-benzyl-2-N,N-dimethylamino-1-(4-morpholinophenyl)-1-butanone) available as Irgacure® 369 photoinitiator from Ciba-Geigy Corporation, and other photoinitiators with high absorption efficiency in the 250–400 nm wavelength range.

The polymerizable monomer preferably comprises an addition polymerizable, non-gaseous (boiling temperature above 100° C. at normal atmospheric pressure), ethylenically-unsaturated compound containing at least one, and preferably at least two, terminal ethylenically unsaturated groups, and being capable of forming a high molecular weight polymer by free radical initiated, chain propagating addition polymerization. The most preferred compounds are acrylate or methacrylate monomers as are well known in the art. Suitable polymerizable monomers nonexclusively include triethylene glycol dimethacrylate, tripropylene glycol diacrylate, tetraethylene glycol dimethacrylate, diethylene glycol dimethacrylate, 1,4-butanediol diacrylate, 1,6-hexanediol dimethacrylate, pentaerythritol tetraacrylate, trimethylol propane triacrylate, trimethylol propane trimethacrylate, di-pentaerythritol monohydroxypentaacrylate, pentaerythritol triacrylate, bisphenol-A-ethoxylate dimethacrylate, trimethylolpropane ethoxylate triacrylate, trimethylolpropane propoxylate triacrylate, bisphenol A diepoxide dimethacrylate.

Suitable binding resins include resin from U.S. Pat. No. 4,670,507 and styrene maleic anhydride copolymers, such as Scripset® 540 resin from Monsanto. An important resin selection criterion is that it must be a good film former.

Suitable adhesive resins include the Carboset® resins offered by The BF Goodrich Company and polyvinyl acetate polymers available from Hoechst.

The two layer system of the present invention (release layer plus photosensitive color layer) does not contain a separate adhesive layer which would increase the overall thickness of the finished four-color proof. Conventional proofing systems (i.e. those single-sheet, offpress proofs which employ separate adhesive layers) exhibit relatively high midtone dot gains, in the low to mid 20 percent range. The absence of separate adhesive layers provides a four color proof that gives an average dot gain at 40 percent tint and a 6000 lines/meter (150 lines/inch) screen ruling ranging from about 12 to 16 percent. This would provide a much closer match to the press's dot gain. It is widely accepted in the industry that the key to accurately predicting the printed results is a proof that closely reflects the press's dot gain curve. Additionally, the photopolymer color layer of the present invention provides cleaner colors than that offered by other products. A wider color gamut will also result.

The colorants useful for the present invention include various classes of dyes and pigments. In the most preferred embodiment, pigments having an average particle size of about $1 \times 10^{-6}$ meter (1 micrometer) or less are used.

Optional plasticizers which may be incorporated into the photosensitive layer include those of the phthalate and phosphate types. Preferred plasticizers include dibutyl phthalate and dimethyl phthalate. Polymeric plasticizers, such as Resolfex® R-296 plasticizer from Cambridge Industries, may also be incorporated. Acid stabilizers include phosphoric acid and p-toluene sulfonic acid.

These ingredients may be blended with such compatible solvents as ethanol, methyl cellosolve and methyl ethyl ketone, coated on the release surface, and dried. In the present invention, the photosensitive layer has a dry coating weight between 0.1 and 5.0 $g/m^2$, preferably from about 0.1 to about 3.0 $g/m^2$, most preferably from about 0.5 to about 2.0 $g/m^2$.

In the preferred embodiment, the photosensitizer is present in the photosensitive layer in an amount of from about 5 to about 40 percent by weight; or more preferably from about 10 to about 35 percent by weight.

In the preferred embodiment, the colorant is present in the photosensitive layer in an amount of from about 10 to about 40 percent by weight; or more preferably from about 13 to about 34 percent by weight.

In the preferred embodiment, the film forming binding resin is present in the photosensitive layer in an amount of from about 25 to about 80 parts by weight; or more preferably from about 32 to about 75 parts by weight.

In the preferred embodiment, the plasticizer, when one is used, is present in the photosensitive layer in an amount of up to about 20 parts by weight; or more preferably up to about 15 parts by weight and most preferably from about 12 to about 15 parts by weight.

In the preferred embodiment, the acid stabilizer, when one is used, is present in the photosensitive layer in an amount of up to about 20 parts by weight.

In the preferred embodiment, the adhesive resin is present in the photosensitive layer in an amount of from about 0.2 to about 50 percent by weight; or more preferably from about 0.5 to 25 percent by weight.

In operation, the photosensitive element is laminated to a receptor sheet via the photosensitive layer. The receiver sheet should be resistant to any adverse effects which may be caused by the developer of choice. For example, the receiver sheet should be water resistant when aqueous developers are used. Plastic or plastic coated receiver sheets are useful for this purpose.

Useful receiver sheets include Melinex® 329; 339; 994 and 3020 films from ICI. Other white and non-white receiver sheets may also be used rough textured and/or adhesion promoted surfaces are preferred for the receiver, which must be able to withstand the laminating and development processes.

Lamination may be conducted by putting the receiver sheet in contact with the photosensitive side of the colored composite and then introducing the two materials into the nip of a pair of heated laminating rollers under suitable pressure. Suitable laminating temperatures usually range from about 60° C. to about 100° C., preferably about 75° C. to about 95° C. After lamination, the substrate is peeled away, usually merely employing manual peeling forces. The photosensitive layer thus remains on the receiver sheet.

The photosensitive layer is imagewise exposed by means well known in the art either before or after lamination. Such exposure may be conducted by exposure to a UV light source through a photomask under vacuum frame conditions. Exposure may be performed with actinic light through a conventional negative flat. Exposures after lamination and removal of the substrate are preferred for emulsion-to-emulsion contact. Mercury vapor discharge lamps are preferred over metal halide lamps. Filters may be used to reduce light scattering in the material.

The photosensitive layer is developed by removing the nonimage area in a suitable developer at a temperature at which said photosensitive layer is substantially nontacky. Suitable developers include aqueous solutions comprising surfactants without organic solvents. Suitable developers non-exclusively include:

|  | Parts by weight |
|---|---|
| I. | |
| water | 95.0 |
| sodium decyl sulphate | 3.0 |
| disodium phosphate | 1.5 |
| sodium metasilicate | 0.5 |
| II. | |
| water | 89.265 |
| monosodium phosphate | 0.269 |
| trisodium phosphate | 2.230 |
| sodium tetradecyl sulfate | 8.237 |

Any developer solution which satisfactorily removes the nonimage areas of the photosensitive layer after exposure while retaining the image areas may be used. The selection of developer is well within the ability of the skilled artisan.

The preferred developer of the present invention comprises an aqueous solution of an anionic surfactant. After development, the imaged photosensitive layer is dried.

The process can then be repeated whereby another photosensitive element having a different color is laminated to the same receiver sheet over the previously formed image. In the usual case, four colored layers are employed to produce a full color reproduction of a desired image. These are cyan, magenta, yellow and black.

The following nonlimiting examples serve to illustrate the invention.

EXAMPLE 1

A release layer solution was made as follows:

|  | Parts by Weight |
|---|---|
| Deionized Water | 90.00 |
| Polyvinyl alcohol (Mowiol ® 488, Hoechst) | 2.70 |
| Polyvinyl alcohol (Mowiol ® 2688, Hoechst) | 6.95 |
| Triton ® X-100 surfactant (Rohm & Haas) | 0.35 |

This solution was coated on 3 mil thick slip treated polyethylene terephthalate film (Melinex® 516 from ICI) with a #12 Meyer rod and dried.

Four colored photosensitive solutions were prepared as follows:

|  | Cyan | Yellow | Magenta | Black |
|---|---|---|---|---|
|  | Parts by Weight | | | |
| 1-Methoxy-2-propanol | 45.00 | 50.00 | 50.00 | 50.00 |
| 2-Butanone | 20.00 | 20.00 | 20.00 | 20.00 |
| Gamma-butyrolactone | 15.00 | 20.00 | 20.00 | 20.00 |
| Resin from U.S. Pat. No. 4,670,507 | 5.00 | 2.50 | 1.50 | 2.50 |
| Carboset ® 525 acrylic resin (B. F. Goodrich) | 3.00 | 1.00 | 1.00 | 1.00 |
| Dipentaerythritol monohydroxy-pentaacrylate (SR ®-399, Sartomer) | 9.00 | 5.00 | 6.00 | 5.00 |
| 2-(4-phenyl)phenyl-4,6-bis-trichloromethyl-s-triazine from U.S. Pat. No. 4,696,888 | 2.00 | 1.00 | 1.00 | 1.00 |
| Cyan pigment | 1.00 | — | — | — |
| Yellow pigment | — | 0.50 | — | — |
| Magenta pigment | — | — | 0.50 | — |
| Black pigment | — | — | — | 0.50 |

The pigments were introduced as dispersions in part of the poly(vinylacetal-co-vinylalcohol-co-vinylacetate) resin from U.S. Pat. No. 4,670,507 and part of the 1-Methoxy-2-propanol and the Gamma-butyrolactone. The pigments were dispersed until the mean pigment particle size was less than 1 micrometer (micron). The solutions were then coated over the dired release coating to optical densities of 1.15, 0.64, 1.50 and 1.36 for the cyan, yellow, magenta, and black films, respectively, as measured with a reflection densitometer. The cyan photosensitive film was then laminated by heat and pressure at 104° C. (220° F.) to an aqueous developer resistant receiver stock (Pressmatch® Commercial Receiver Stock, available from Hoechst Celanese Corporation, with a cross-lined acrylic subbing layer on the top surface). The temporary support was peeled away and the colored photosensitive layer was imagewise exposed to actinic light through a color separation negative film. The image was developed with an aqueous alkaline developer consisting of the following:

|  | Parts by Weight |
|---|---|
| Water | 89.264 |
| Monosodium phosphate | 0.269 |
| Trisodium phosphate | 2.230 |
| Sodium tetradecyl sulfate | 8.237 |

The process was then repeated with the yellow, magenta, and black films to produce a four color proof. The dot gain for the four color layers at a 40% tint and a 59 lines per centimeter (150 lines per inch) screen ruling was 16%, 12%, 14% and 19% for cyan, yellow, magenta and black, respectively.

EXAMPLE 2

A stock solution for use with yellow, magenta, cyan, and black pigment dispersions and other ingredients was prepared with the following composition:

|  | Parts by weight |
|---|---|
| Stock Solution | |
| 1-Methoxy-2-Propanol | 172.95 |
| Methyl Ethyl Ketone | 57.63 |
| Tetrahydrofuran | 57.63 |
| Styrene Maleic Anhydride Copolymer (Scripset ® 540, Monsanto) (dimethyl polysiloxane) | 11.76 |
| BYK ® 301 (BYK-Chemie USA) | 0.06 |
| Polyvinyl acetate (Mowilith ® 30, Hoechst) | 0.91 |
| Total | 300.94 |
| A yellow photosensitive solution was prepared with the following: | |
| Above Stock Solution | 82.74 |
| Dipentaerythritol Monohydroxypentaacrylate (SR ®-399, Sartomer) | 6.24 |
| 2-(4-styrylphenyl)-4,6-bis-trichloromethyl-s-triazine from U.S. Pat. No. 4,619,998 | 0.22 |
| Yellow Pigment Dispersion (consisting of 44.5 parts 1-Methoxy-2-propanol, 44.5 parts Gamma-butyrolactone, 6.0 parts resin from U.S. Pat. No. 4,670,507, and 5.0 parts Yellow pigment) | 10.80 |

The yellow solution was coated, at a dry coating weight of approximately 1 g/m$^2$, over the dried release coating prepared in Example 1. The yellow photosensitive film was laminated to a paper receiver stock (3M® receiver base) that was adhesion-promoted using a 3M® Laminator with temperature settings of 132° C. (270° F.) for the upper roller and 59° C. (138° F.) for the lower roller. The polyester film carrier was peeled away and the colored photosensitive layer was imagewise exposed to actinic light through an Ugra® target. Development, as in Example 1, yielded highlight and shadow dot reproduction of 2 and 98 percent, respectively.

EXAMPLE 3

Using the same formulations described in Example 2, a magenta photosensitive solution was prepared by replacing the yellow pigment dispersion with magenta pigment dispersion consisting of 44.8 parts by weight 1-Methoxy-2-propanol, 44.8 parts Gamma-butyrolactone, 5.2 parts resin from U.S. Pat. No. 4,670,507, and 5.2 parts magenta pigment. In the same process as in Example 2, exposure and development produced 2 and 98 percent highlight and shadow dots, respectively, with an Ugra® target.

EXAMPLE 4

Using the same formulations described in Example 2, a cyan photosensitive solution was prepared by replacing the yellow pigment dispersion with cyan pigment dispersion consisting of 44.0 parts by weight 1-Methoxy-2-propanol, 44.0 parts Gamma-butyrolactone, 5.5 parts resin from U.S. Pat. No. 4,670,507, and 6.5 parts cyan pigment. Using the same process as in Example 2, upon exposure and development, 2 percent highlight and 98 percent shadow dots were obtained with an Ugra® target.

EXAMPLE 5

Using the same formulations described in Example 2, a black photosensitive solution was prepared by replacing the yellow pigment dispersion with black pigment dispersion consisting of 45.0 parts by weight 1-Methoxy-2-propanol, 45.0 parts Gamma-butyrolactone, 4.5 parts resin from U.S. Pat. No. 4,670,507, and 5.5 parts black pigment. Using the same process as in Example 2, after exposing through an Ugra® target and developing the negative image, 1 percent highlight and 99 percent shadow dots were obtained.

EXAMPLE 6

The processes described in Examples 2, 3, 4, and 5 were repeated with Ugra and Stouffer targets in sequence—yellow, magenta, cyan, black—on the same 3M® Commercial Receiver Base to produce a four-color proof with the following results:

| Target Results | Yellow | Magenta | Cyan | Black |
| --- | --- | --- | --- | --- |
| Stouffer Clear Step | 7 | 5 | 7 | 11 |
| Highlight Dots | 1% | 2% | 1% | 1% |
| Shadow Dots | 98% | 99% | 98% | 99% |
| Micro-lines | 12μ | 10μ | 12μ | 10μ |
| Dot Gain 40% Ugra ® | 13 | 13 | 13 | 15 |

What is claimed:

1. A method for forming a colored image which comprises:

A) providing a photosensitive element which comprises, in order:
  i) a substrate having a release surface; and
  ii) a photosensitive layer coated, at a coating weight of from about 0.1 to 5.0 g/M², directly on said release surface, which photosensitive layer comprises: 1) a light sensitive, negative working, photopolymerizable composition, which composition contains a photoinitiator and a polymerizable monomer; and 2) a film forming resinous binder composition, which composition contains a styrene maleic anhydride copolymer; 3) an adhesive resin; and 4) at least one colorant, and B) either
  i) laminating said element with heat and pressure with said photosensitive layer being laminated directly to a an adhesion promoted surface of a developer resistant receiver sheet; and removing said substrate by the application of peeling forces; and imagewise exposing said photosensitive layer to actinic radiation; and removing nonexposed areas of a negative working photosensitive layer with a liquid developer; or
  ii) imagewise exposing said photosensitive layer to actinic radiation; and laminating said element with heat and pressure with said photosensitive layer being laminated directly to an adhesion promoted surface of a developer resistant receiver sheet; and removing said substrate by the application of peeling forces; and removing nonexposed areas of a negative working photosensitive layer with a liquid developer; or
  iii) laminating said element with heat and pressure with said photosensitive layer being laminated directly to an adhesion promoted surface of a developer resistant receiver sheet; and imagewise exposing said photosensitive layer to actinic radiation; and removing said substrate by the application of peeling forces; and removing nonexposed areas of a negative working photosensitive layer with a liquid developer;

whereby a colored image is formed on the adhesion promoted surface of the receiver sheet, and wherein steps A and B are repeated at least once wherein another photosensitive element having at least one different colorant is laminated onto said adhesion promoted surface of the receiver sheet with its photosensitive layer laminated directly to the nonremoved portions of the previous image.

2. The method of claim 1, wherein said substrate comprises polyethylene terepthalate.

3. The method of claim 1, wherein said substrate has a matte surface.

4. The method of claim 1, wherein said release surface on said substrate comprises polyvinyl alcohol.

5. The method of claim 1, wherein said photosensitive layer further comprises one or more ingredients selected from the group consisting of plasticizers, acid stabilizers, antistatic compositions, uv absorbers and surfactants.

6. The method of claim 1, wherein the coating weight of the photosensitive layer ranges from about 0.1 to about 3.0 g/m².

7. The method of claim 1, wherein the photosensitizer is present in the photosensitive layer in an amount of from about 5 to about 40 percent by weight.

8. The method of claim 1, wherein the adhesive resin is present in the photosensitive layer in an amount of from about 0.2 to about 50 percent by weight.

9. The method of claim 1, wherein the film forming binding resin is present in the photosensitive layer in an amount of from about 25 to about 80 percent by weight.

10. The method of claim 1, wherein a plasticizer is present in the photosensitive layer in an amount of up to about 20 percent by weight.

11. The method of claim 1, wherein an acid stabilizer is present in the photosensitive layer in an amount of up to about 20 percent by weight.

12. The method of claim 1, wherein the laminating step is conducted at a temperature of from about 60° C. to about 100° C.

* * * * *